United States Patent [19]

McKelvey

[11] 4,356,073
[45] Oct. 26, 1982

[54] MAGNETRON CATHODE SPUTTERING APPARATUS

[75] Inventor: Harold E. McKelvey, Plymouth, Mich.

[73] Assignee: Shatterproof Glass Corporation, Detroit, Mich.

[21] Appl. No.: 233,974

[22] Filed: Feb. 12, 1981

[51] Int. Cl.³ .............................................. C23C 15/00
[52] U.S. Cl. ................................ 204/192 R; 204/298
[58] Field of Search ................ 204/192 R, 192 C, 298

[56] References Cited

U.S. PATENT DOCUMENTS

| 4,221,652 | 9/1980 | Kuriyama | 204/298 |
| 4,290,877 | 9/1981 | Buckensderfer | 204/298 |

FOREIGN PATENT DOCUMENTS

| 2707144 | 8/1977 | Fed. Rep. of Germany | 204/298 |
| 2820301 | 11/1979 | Fed. Rep. of Germany | 204/298 |

OTHER PUBLICATIONS

W. W. Anderson et al., "Magnetron Reactive Sputtering Deposition of Cu₂S/CdS Solar Cells", Proceedings, 2nd European Community Solar Energy Conf. (1979), pp. 890–897.

Primary Examiner—Aaron Weisstuch
Attorney, Agent, or Firm—William E. Nobbe

[57] ABSTRACT

A rotatable magnetron cathode sputtering apparatus for operation within an evacuable chamber for coating substrates that are also contained within said chamber. The cathode comprises an elongated cylindrical tube having a layer of the coating material or materials to be sputtered applied to the outer surface thereof. Magnetic means is mounted within the tube and includes at least one row of permanent U-shaped magnets extending lengthwise of the tube. The tube is horizontally disposed and rotatably mounted in the coating chamber such that it can be turned on its longitudinal axis relative to the magnets to selectively bring different portions or segments of the same sputtering material or different sputtering materials into sputtering position with respect to the magnets and within the magnetic field. Means is also provided for internally cooling the cathode.

12 Claims, 9 Drawing Figures

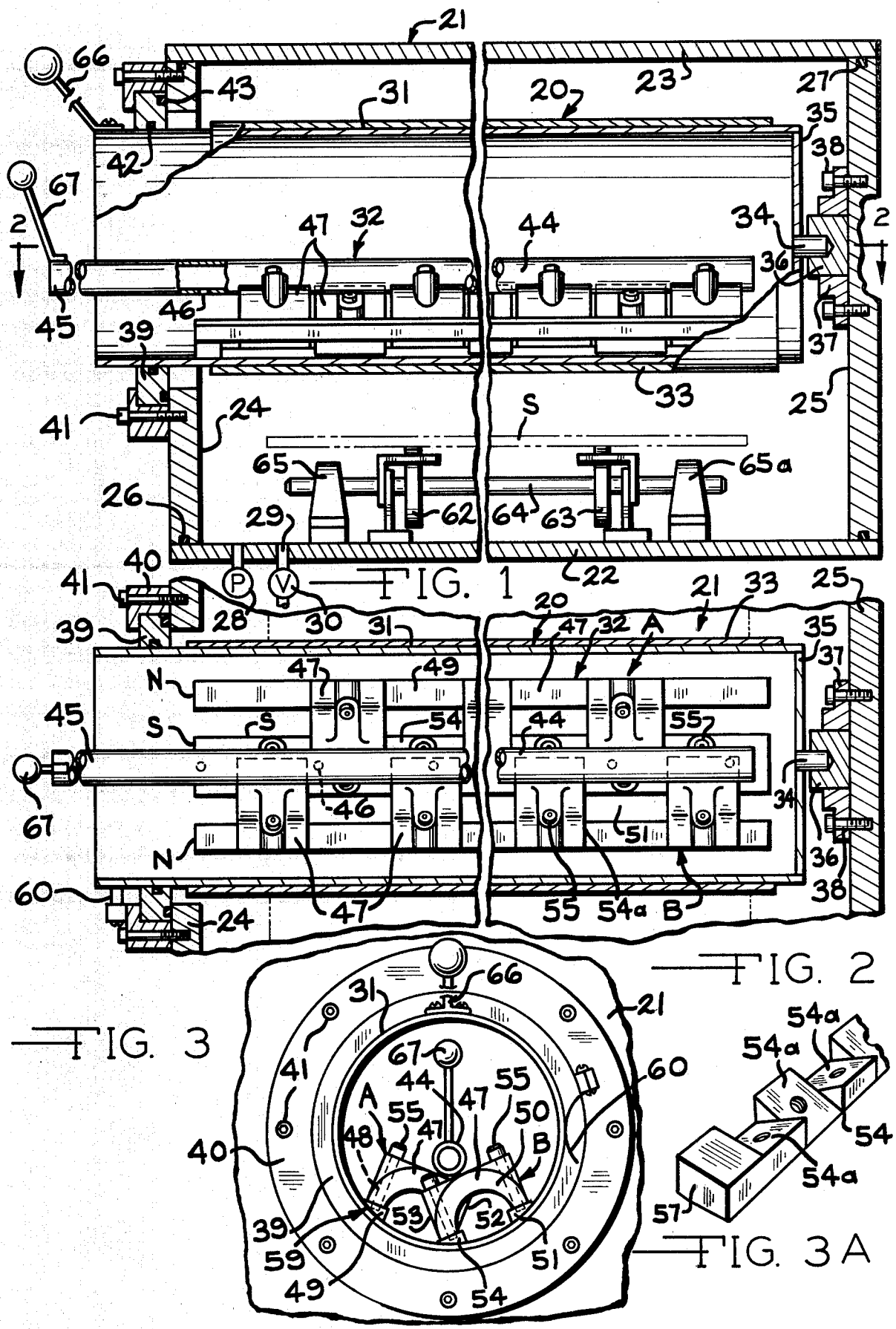

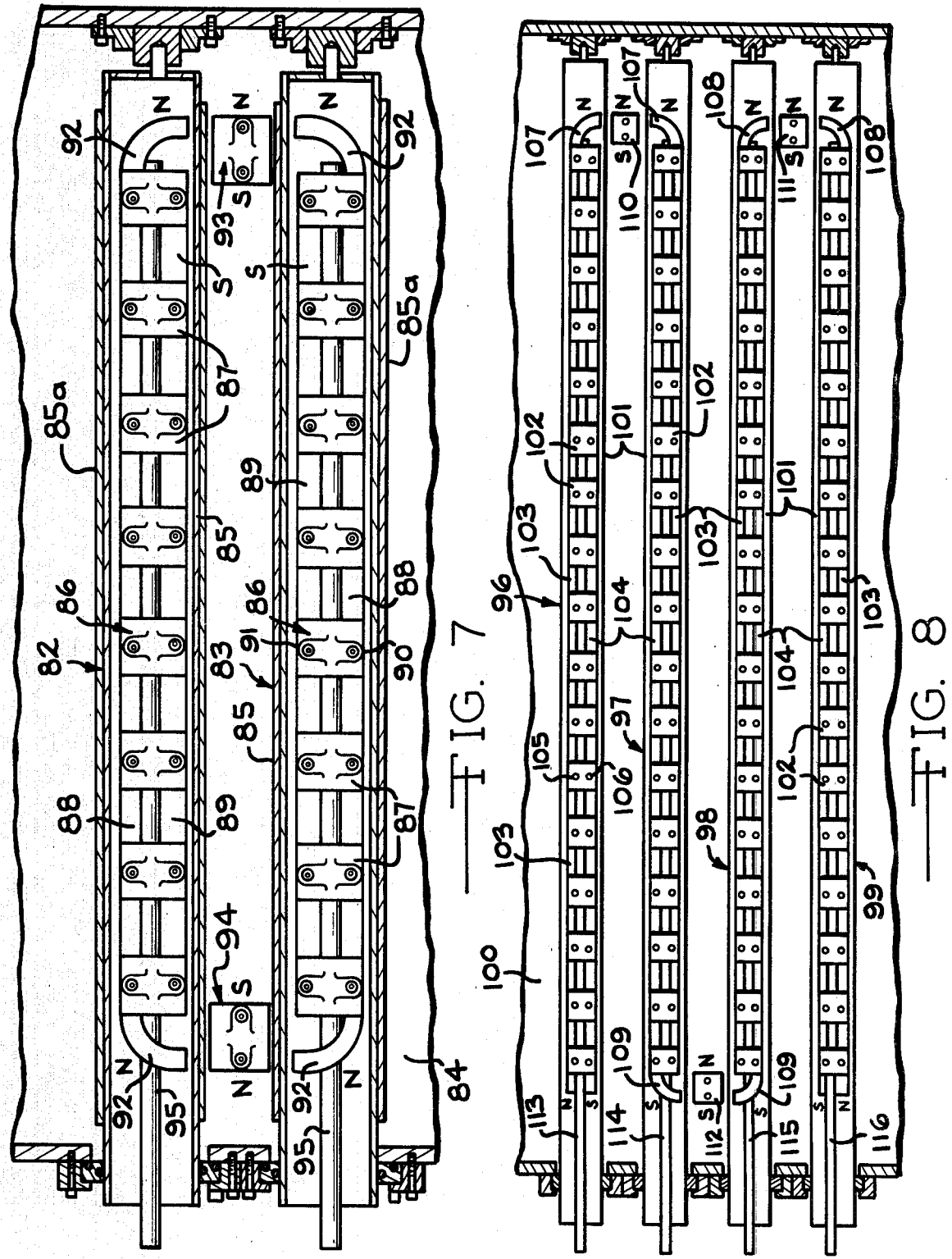

MAGNETRON CATHODE SPUTTERING APPARATUS

BACKGROUND OF THE INVENTION

The present invention relates broadly to apparatus for cathode sputtering and more particularly to an improved magnetron cathode sputtering system.

Cathode sputtering is widely used for depositing thin films of material onto substrates. Such a process involves generally ion bombarding a flat target plate of the material to be sputtered in an ionized gas atmosphere in an evacuable coating chamber in which a controlled vacuum is maintained to cause particles of the target plate material to be dislodged and deposited as a thin film on the substrate being coated. The target plate, to which a layer of the coating material to be sputtered is applied, is generally of elongated, rectangular form, with the substrate to be coated being moved either continuously or intermittently therebeneath. The longitudinal axis of the target plate is transverse to the direction of substrate movement.

In an endeavor to attain increased deposition rates the use of magnetically enhanced cathodes has been proposed. Such cathodes are known as planar magnetron cathodes and customarily include an array of permanent magnets arranged in a closed loop and mounted in a fixed position in relation to the flat target plate. Thus, the magnetic field is caused to travel in a closed loop, commonly referred to as a "race track" which establishes the path or region along which sputtering or erosion of the target plate material takes place.

One drawback of the conventional flat plate target, however, is that the race track along which sputtering takes place is relatively narrow so that erosion occurs in a relatively narrow ring-shaped region corresponding to the shape of the closed loop magnetic field. As a result, only a relatively small portion of the total target material in the so-called race track region is consumed before the target must be replaced.

SUMMARY OF THE INVENTION

The present invention contemplates a new and novel form of magnetron cathode which is significantly different from the planar magnetron cathodes heretofore proposed and which, while retaining the advantages of high deposition rates, also renders possible an even more effective and maximum utilization of the target material thereby substantially increasing the operating life thereof.

According to the invention, the cathode assembly comprises an elongated, cylindrical rotatable tube having a layer of the target material to be sputtered applied to the outer surface thereof. Magnetic means including an array of U-shaped permanent magnets is arranged inside the tube, with the opposite legs of the magnets being secured to spaced, parallel magnetic strips running lengthwise of the tube. The tube is rotatable about its longitudinal axis so that it can be turned relative to the magnets to selectively bring different portions or segments of the target material on the outer surface thereof into position opposite the magnets and within the magnetic field. Also different coating materials can be applied to different portions of the outer surface of the rotatable tube so that by turning the tube a particular selected coating material can be brought into sputtering position. The cathode assembly is internally cooled by the circulation of a cooling liquid therethrough.

These and other features and advantages of the invention will be apparent from the following description, with reference to the accompanying drawings.

BRIEF DESCRIPTION OF THE DRAWINGS

FIG. 1 is a vertical longitudinal section through a coating chamber showing in elevation a magnetron cathode constructed in accordance with the present invention mounted therein, FIG. 2 is a horizontal longitudinal section taken substantially on line 2—2 of FIG. 1, FIG. 3 is an end view of FIG. 1, FIG. 3A is a perspective view of a portion of one of the magnetic strips.

DESCRIPTION OF THE PREFERRED EMBODIMENTS

Figure 4:
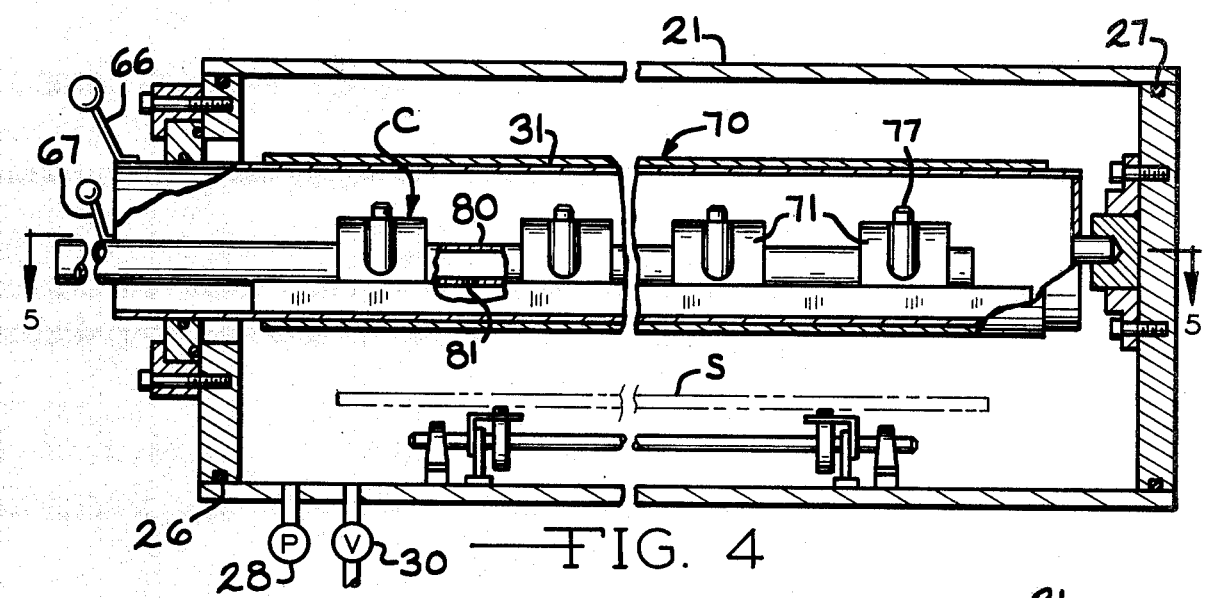
FIG. 4 is a view similar to FIG. 1 illustrating another embodiment of the invention.

Referring to the drawings and particularly to the embodiment of the invention illustrated in FIGS. 1, 2 and 3, the cathode assembly is designated by the numeral 20 and is mounted in an evacuable coating chamber 21. The coating chamber is rectangular and is composed of a bottom wall 22, top wall 23, opposite side walls 24 and 25 and end walls (not shown) The bottom and top walls 22 and 23 are suitably joined to the side walls 24 and 25 at the hermetic seals 26 and 27 respectively. The end walls are similarly sealed to the top and bottom and side walls. A vacuum pump 28 is provided to evacuate the coating chamber 21 to the desired pressure. Should it be desired to inject gases into the chamber, it may be done through conduit 29 controlled by a valve 30.

The cathode assembly 20 comprises generally an elongated cylindrical tube 31 mounted in the coating chamber 21 and in the lower portion of which is mounted the magnetic means 32. The tube 31 is formed of a suitable non-magnetic material such as, for example, brass or stainless steel and is of a diameter, wall thickness and length required for the operation to be performed.

Applied to the outer surface of the tube 31 is a layer 33 of a selected coating or target material to be deposited onto the substrates being coated. Thus, the tube 31 and layer of coating material 33 constitute a tubular target or sputtering source as distinguished from the conventional planar target.

The tube 31 is supported in a horizontal position in the coating chamber 21 and is mounted for rotation about its longitudinal axis. For this purpose, the tube is supported at its inner end by a trunnion 34 secured to the closed inner end 35 of the tube and journaled in a bearing block 36 carried by a bracket 37 secured to the side wall 25 of the coating chamber by screws 38.

The tube 31 is open at its outer end and extends through an opening in the side wall 24 of the coating chamber 21, where it is supported in an annular ring 39 surrounded by a collar 40 secured to said side wall 24 by screws 41. The interior of the coating chamber is sealed from the atmosphere by O-rings 42 and 43 engaging the tube 31 and side wall 24 of the coating chamber respectively.

To provide the requisite cooling of the cathode assembly there is provided a coolant conduit 44 also of a suitable non-magnetic material extending longitudinally in the lower portion of the tube 31. The inner end of said conduit is closed and spaced from the closed inner end 35 of tube 31, while the outer end thereof extends beyond the tube as indicated at 45. A suitable coolant, such as water, is introduced into the outer end of the conduit 44 and, after passing through openings 46 therein, circulates throughout the tube 31 and exits at the outer end thereof.

The magnetic means 32 comprises an array of U-shaped permanent magnets 47 arranged in two straight parallel rows A and B that extend lengthwise within the tube 31. The magnets 47 in each row are aligned with one another, with the magnets in one row being disposed alternately with and overlapping the magnets in the other row. Also the magnets in the two rows A and B are arranged at an angle relative to one another, as shown in FIG. 3, and are secured to the conduit 44 by suitable brackets or the like.

The outer legs 48 of the magnets 47 in row A engage a longitudinally extending, relative narrow strip 49 of a suitable magnetic material, such as hot rolled mild steel, while the outer legs 50 of the magnets in row B engage a similar magnetic strip 51 arranged parallel with magnetic strip 49. The inner legs 52 and 53 of the magnets in rows A and B overlap one another and engage a central longitudinally extending magnetic strip 54 that extends parallel with the outer magnetic strips 49 and 51. The magnets 47 are secured to the respective magnetic strips by screws 55 passing therethrough to tie them together as a unit. The bottom surfaces 59 of the magnetic strips 49, 51 and 54 are shaped to conform to the curvature of the inner surface of the tube 31. The central magnetic strip 54 is notched on a slant alternately first to one side and then the other, as indicated at 54a in FIG. 3A, such that the inner legs 52 and 53 of the magnets will make fiace-to-face contact with said strip.

The magnets 47 are preferably disposed so that the north poles thereof engage the outer magnetic strips 49 and 51, while the south poles of the magnets engage the central magnetic strip 54. This arrangement of the magnets and magnetic strips establishes two straight magnetic fields along which erosion of the target material 33 takes place.

A cathode potential sufficient to cause sputtering to occur is supplied to the tubular target from a D.C. power source (not shown) through a power line 60 having sliding contact with the tube 31. The apparatus is grounded in any suitable manner.

The Substantially Planar substrates S to be coated are supported on and carried through the coating chamber 21 and beneath the cathode 20 by rollers 62 and 63 keyed to a horizontal shaft 64 journaled in bearing blocks 65 and 65a supported on the bottom of the coating chamber.

As stated above, the outer surface of the tube 31 is provided with a layer 33 of the material to be sputtered on the substrates S as they pass therebeneath. By means of the handle 66 secured to the outer end of the tube 31 the tube can be rotated either clockwise or counterclockwise about its longitudinal axis to position a selected portion of the coating material to be sputtered directly opposite the magnets and within the magnetic field. When this portion of the coating material has been depleted, the tube can again be rotated to bring another and fresh portion of the coating material into sputtering position. This procedure can be repeated until a maximum amount of the coating material has been utilized.

Also by applying different coating materials to different portions of the outer surface of the rotatable tube a particular selected coating material can be brought into sputtering position. In this way, it is possible to sputter different coating materials onto the substrates from a single target.

The magnetic means 32 are supported on the tube 31, with the magnetic strips 49, 51 and 54 in direct contact with the inner surface thereof. With such an arrangement, upon rotation of the tube 31, and due to the frictional contact between the tube and the magnetic strips, the magnets may be moved slightly with the tube from their original position relative to that portion of the coating material to be sputtered. Should this occur, it can be readily corrected and the magnets returned to their original position by turning the conduit 44, by mans of the handle 67 secured to the outer end thereof, to move the magnets in the reverse direction.

OTHER EMBODIMENTS OF THE INVENTION

Figure 5:
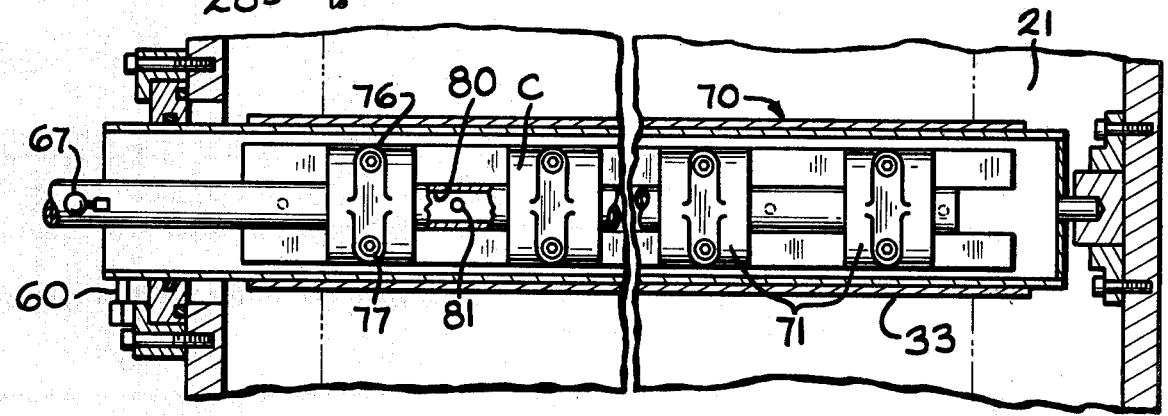
FIG. 5 is a horizontal longitudinal section taken substantially on line 5—5 of FIG. 4.
Figure 6:
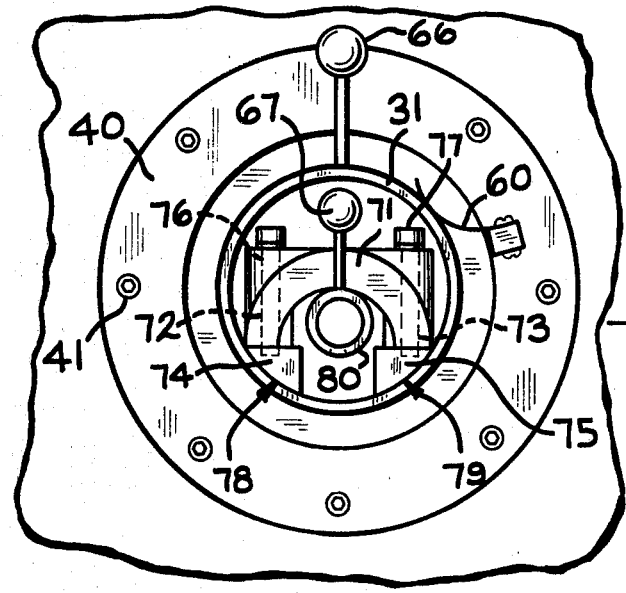
FIG. 6 is an end view of FIG. 4, and FIGS. 7 and 8 are generally schematic plan views illustrating two other modified forms of the invention.

FIGS. 4, 5 and 6 are views similar to FIGS. 1, 2 and 3 respectively but disclose an alternate form of magnetic means 70. Otherwise, the construction and operation of the apparatus are the same as above described with reference to FIGS. 1, 2 and 3 and the same numerals are used to designate like parts.

In this form of the invention, the magnetic means 70 is composed of a single row C of permanent U-shaped magnets 71, the legs 72 and 73 of which engage spaced, longitudinally extending magnetic strips 74 and 75 respectively and are secured thereto by screws 76 and 77. The bottom surfaces 78 and 79 of the magnetic strips 74 and 75 are shaped to conform to the curvature of the inner surface of the tube 31. In this embodiment, the established magnetic field also follows a straight path to create a straight erosion pattern on the target material.

Extending longitudinally within the tube 31 and beneath the row of magnets 71 is a coolant conduit 80 to which the magnets are secured. A cooling liquid, such as water, is introduced into the outer end of the conduit and discharged therefrom through openings 81 into the tube. The cooling liquid, after circulating within the tube 31, exits therefrom through the outer end thereof.

The tube 31 can also be rotated by means of the handle 66 to selectively position different portions of the coating material opposite the magnets and within the magnetic field. Likewise, after the tube has been turned to place the selected unused portion of the coating material in sputtering position, the magnetic means can be adjusted, if necessary, by means of the handle 67 to again bring the magnets into proper position relative to that portion of the coating material to be sputtered.

In FIGS. 7 and 8 are illustrated in somewhat schematic form two other modified embodiments of the invention, in each of which a plurality of rotatable cathodes of the type shown in FIGS. 4, 5 and 6 are employed.

With reference to FIG. 7, two cathode assemblies 82 and 83 are horizontally disposed in spaced side-by-side relation in an evacuable coating chamber 84. Each cathode assembly comprises an elongated, cylindrical tube 85 mounted for rotation in the opposite side walls of the coating chamber 84 and having a layer of the coating material 85a to be sputtered applied to the outer surface thereof. Located within the tube 85 are the magnetic means 86 composed of a single row of permanent U-shaped magnets 87, the opposite legs of which engage longitudinally extending magnetic strips 88 and 89 and are secured thereto by screws 90 and 91 respectively.

The outer magnetic strip 88 of each cathode assembly constitutes the north pole piece and the inner magnetic strip 89 the south pole piece. The outer magnetic strips 88 extend beyond the inner magnetic strips 89 and are turned inwardly toward one another as indicated at 92. Positioned between the cathodes 82 and 83 at the opposite ends thereof are the additional permanent U-shaped magnets 93 and 94 which bridge the gap between the inturned ends 92 of the magnetic strips 88 and in conjunction therewith establish a magnetic field in the form of a closed loop or race track. The cathodes 82 and 83 are internally cooled by the introduction of a cooling liquid into the coolant conduits 95 as above described with reference to FIGS. 1, 2 and 3.

The tubes 85 of the cathodes 82 and 83 are rotatable independently of one another to bring the desired unused portion of the coating material on the outer surface thereof into proper registration with the respective row of magnets. Either the same or different types of coating materials can be applied to the tubes.

The embodiment of the invention illustrated in FIG. 8 distinguishes from that disclosed in FIG. 7 in that four cathode assemblies 96, 97, 98 and 99 are mounted in horizontally spaced, parallel relation in the coating chamber 100. These cathode assemblies are preferably of the same type as shown in FIG. 7, with each comprising an elongated, cylindrical rotatable tube 101 having a layer of the material to be sputtered applied to the outer surface thereof. Also, the magnetic means with the tube 85 of each cathode is composed of a single row of permanent U-shaped magnets 102, the opposite legs of which engage and are secured to the magnetic strips 103 and 104 by screws 105 and 106 respectively.

The magnetic strips 103 constitute north pole pieces, while the magnetic strips 104 constitute south pole pieces. The magnetic strips 103 of cathodes 96–97 and 98–99 extend at one end beyond the associated strips 104 and are turned inwardly as indicated at 107 and 108 respectively. On the other hand, the magnetic strips 104 of the magnets 97 and 98 extend beyond the associated magnetic strips 103 at the other end of the rows of magnets and are turned inwardly toward one another as indicated at 109.

Located between the inturned ends 107 of magnetic strips 103 of cathodes 96 and 97 is a permenent U-shaped magnet 110 and a similar magnet 111 is positioned between the inturned ends 108 of the magnetic strips 103 of cathodes 98 and 99. Also positioned between the inturned ends 109 of the magnetic strips 104 of magnets 97 and 98 is a like permenent magnet 112. The individual magnets 110, 111 and 112 at the opposite ends of the cathodes serve to bridge the gaps between the associated magnetic strips and in conjunction therewith act to complete the magnetic field which follows a serpentine path from cathode 96 to cathode 99.

The tubes 101 of the cathodes 96, 97, 98 and 99 are mounted in the coating chamber 100 for individual rotation relative to one another and may be provided with the same or different types of coating materials. The cathodes are also adapted to be internally cooled as described above through the coolant conduits 113, 114, 115 and 116 to which the associated magnets 102 are secured.

While there has been illustrated and described herein preferred embodiments of the invention, it will be understood that changes and modifications may be made without departing from the spirit and scope of the claims. By way of example, different types of permanent magnets as well as electromagnets may be employed in lieu of U-shaped permanent magnets.

I claim:

1. A method of sputtering thin films of a selected coating material upon substantially planar substrates, in which there is provided an evacuated coating chamber enclosing an elongated, cylindrical tubular member having a layer of the coating material to be sputtered applied to the outer surface thereof, establishing within said tubular member a magnetic field to provide an erosion zone on the coating material extending substantially the entire length of the tubular member and circumferentially along a relatively narrow region thereof, rotating said tubular member about its longitudinal axis to bring different portions of the coating material into sputtering position opposite the magnetic field, and moving the substantially planar substrates horizontally beneath said erosion zone in a linear path to receive the sputtered material.

2. In apparatus for sputtering thin films of a selected coating material upon substantially planar substrates, an evacuable coating chamber, a cathode mounted horizontally in said coating chamber comprising an elongated, cylindrical tubular member having a layer of the coating material to be sputtered applied to the outer surface thereof, magnetic means located in said tubular member for providing a sputter zone extending substantially the entire length of the tubular member and circumferentially along a relatively narrow region thereof, means for rotating said tubular member about its longitudinal axis to bring different portions of the coating material into sputtering position opposite said magnetic means and within said sputter zone, and means in the coating chamber for supporting the substantially planar substrates horizontally and for transporting them in a linear path beneath the magnetic means to receive the sputtered material.

3. Apparatus as claimed in claim 2, in which said magnetic means comprises an array of individual permanent magnets arranged in at least one row extending lengthwise of said tube.

4. Apparatus as claimed in claim 3, in which said magnets are substantially U-shaped permanent magnets and including magnetic strips extending longitudinally in said tube and engaged by the legs of the U-shaped magnets, and means for securing said magnets to said magnetic strips.

5. Apparatus as claimed in claim 4, in which the magnetic strips are arranged in face-to-face relation with the tube, and in which the surfaces of said magnetic strips facing the tube are shaped to conform to the curvature of the inner surface thereof.

6. Apparatus as claimed in claim 4, including a conduit extending longitudinally within said tube for receiving a cooling liquid in one end and for discharging it through openings therein into said tube from which it exits through an opening at one end thereof, and in which said magnets are secured to said conduit.

7. Apparatus as claimed in claim 6, in which said magnetic strips are arranged in face-to-face relation with the tube, and in which the surfaces of said magnetic strips facing said tube are shaped to conform to the curvature of the inner surface thereof.

8. Apparatus as claimed in claim 4, in which the magnets are arranged in two parallel rows, with the magnets in the two rows being arranged alternately with and overlapping one another.

9. Apparatus as claimed in claim 4, in which the U-shaped magnets are arranged in two parallel rows, with the magnets in the two rows being alternately arranged with and overlapping one another, in which the magnetic strips are arranged in face-to-face relation with the tube, and in which the surfaces of the said strips facing the tube are shaped to conform to the curvature of the inner surface thereof.

10. Apparatus as claimed in claim 9, including a conduit extending longitudinally within said tube for receiving a cooling liquid in one end thereof and for discharging it through openings therein into said tube from which it exits through an opening at one end thereof, in which said magnets are secured to said conduit, and including means for turning said conduit about its longitudinal to move the magnets relative to said tube.

11. Apparatus as claimed in claim 2, in which said tube is closed at one end and open at its opposite end, and including a conduit extending longitudinally within said tube for receiving a cooling liquid in one end and for discharging it through openings therein into said tube from which it exits through the open end thereof.

12. Apparatus as claimed in claim 11, in which said conduit is rotatable about its longitudinal axis relative to said tube, and in which said magnetic means is secured to said conduit for movement therewith.

* * * * *